United States Patent [19]
Garde

[11] Patent Number: 5,396,608
[45] Date of Patent: Mar. 7, 1995

[54] METHOD AND APPARATUS FOR ACCESSING VARIABLE LENGTH WORDS IN A MEMORY ARRAY

[75] Inventor: Douglas Garde, Dover, Mass.

[73] Assignee: Analog Devices, Inc., Norwood, Mass.

[21] Appl. No.: 83,619

[22] Filed: Jun. 28, 1993

[51] Int. Cl.[6] .................. G06F 12/00; G06F 12/04; G11C 8/00
[52] U.S. Cl. .................. 395/400; 395/425; 365/230.02; 365/230.06; 365/230.08; 365/238.5
[58] Field of Search ............. 395/400, 425; 365/238, 365/238.5, 230.03, 230.08, 239, 240, 230.06, 230.02

[56] References Cited

U.S. PATENT DOCUMENTS

| | | | |
|---|---|---|---|
| 4,523,276 | 6/1985 | Maejima et al. | 395/425 |
| 4,675,849 | 6/1987 | Kinoshita | 365/238.5 X |
| 4,797,813 | 1/1989 | Igarashi | 395/425 |
| 4,994,962 | 2/1991 | Mageau et al. | 395/425 |
| 5,305,281 | 4/1994 | Lubeck | 365/230.03 X |

Primary Examiner—Jack B. Harvey
Assistant Examiner—Michael A. Whitfield
Attorney, Agent, or Firm—Wolf, Greenfield & Sacks

[57] ABSTRACT

A method and apparatus for addressing a memory space as a row and column matrix so as to allow the single matrix to store data of various widths, e.g., 16, 32 and 48-bits, with a minimum of wasted memory space. A specified number of the LSBs of the address are used to select a row in the matrix, while the remaining MSBs are used to select a columnar portion. Additional bits indicate the length of the data selected. The MSBs of the address and the additional bits indicating the length of the word accessed are used as inputs to a combinational logic circuit, the outputs of which are coupled to control switches for activating only the appropriate columnar portion of the matrix. Thus, although the LSBs of the address used to select the row activate every bit in that row, the switches are controlled so as to connect to the bus only the bits in that row corresponding to the selected columnar portion.

13 Claims, 7 Drawing Sheets

— KEY —
▨ 48-BIT WORD
☐ 32-BIT WORD
▧ DISCONTIGUOUS 32-BIT WORD BLOCK
▨ ONLY ACCESSIBLE BY ALTERNATE ADDESSING

METHOD AND APPARATUS FOR ACCESSING VARIABLE LENGTH WORDS IN A MEMORY ARRAY

FIELD OF THE INVENTION

The invention pertains to an apparatus for addressing memory space. More particularly, the invention is particularly adapted for addressing the memory space of a digital signal processing microcomputer adapted to store words of various widths.

BACKGROUND OF THE INVENTION

Many DSP chips have distinct memory arrays for storing instructions and data separately, particularly when the instructions are of a different word width than the data. Other DSP chips utilize a single memory module having separate, permanently assigned regions for instruction and data words. Further, if the chip is adapted to operate on data words of several possible widths, the data region of the memory is further broken down into separate regions for each possible word width.

A drawback inherent to either of these designs is that a significant portion of memory space is typically wasted because the amount of memory assigned for storing each different word width must be adequate in size to accommodate a large variety of uses and programs, whether it be a separate memory module or an assigned portion of a single memory module. However, many uses or programs may utilize only a small portion of the memory dedicated to a particular word width. For instance, if a particular use of the DSP chip calls for a very simple program requiring only a small portion of the instruction memory, the remainder of the instruction memory is wasted. The same situation can apply to the various data regions of the memory. For instance, a particular use may require more 32-bit data memory space than is available, while requiring almost none of the 48-bit data memory space. In such situations, the particular chip cannot be used because of a lack of appropriate memory space, despite large amounts of free 48-bit data memory space.

Storing both 32 and 16-bit data typically does not present a problem. It is a well known technique to store two 16-bit words consecutively in a 32-bit wide memory space. However, that solution cannot be applied with respect to 48-bit data in the same memory space.

Accordingly, it is an object of the present invention to provide an improved memory accessing method and apparatus.

It is a further object of the present invention to provide a memory addressing method and apparatus in which the amount of memory dedicated to storing words of a particular width is adaptable.

It is yet another object of the present invention to provide an improved memory addressing method and apparatus.

SUMMARY OF THE INVENTION

The apparatus of the present invention comprises a memory space configured to be addressed as a row and column matrix. For instance, a 32K word memory capable of storing and retrieving words of 16, 32 and 48-bit widths is configured as a matrix of 8 columns of 32-bit words, each column comprising 4K words (or rows). Fifteen bits are required to address 32K words. The apparatus includes a series of switches, each switch controlling a columnar portion of the memory (which may be a fractional portion of a column), the width (in bits) of the switch corresponding to the width of the smallest word which can be stored in the memory. The columnar portion of the memory controlled by each switch cannot communicate with the bus unless the corresponding switch is enabled.

Certain bits of the address, e.g., the 12 LSBs, are used to select and activate a row in the matrix. The remaining bits, e.g., the 3 MSBs, are used to select a columnar portion of the matrix. A word width signal indicates the width of the word being accessed.

In a preferred embodiment, the three column addressing bits are input to a column decoder circuit comprising a sub-decoder for each possible word width and a multiplexer for each M-bit columnar portion of the matrix, where M is the number of bits in the smallest word which can be accessed. The multiplexers are responsive to the word width signal of the address to enable the appropriate sub-decoder while disabling the other sub-decoders.

Combinational logic responsive to the outputs of the multiplexers and the word width signal maps the multiplexer outputs to the switches to enable the appropriate columnar portion of the matrix.

BRIEF DESCRIPTION OF THE DRAWING

The invention will be better understood when the following detailed description of the invention is read in conjunction with the drawings, of which:

FIG. 4A is a diagrammatic representation of the memory module of FIG. 2 showing a first possible memory configuration;

FIG. 4B is a diagrammatic representation of the memory module of FIG. 2 showing a second possible memory configuration;

DETAILED DESCRIPTION OF THE INVENTION

The invention described herein is adaptable for addressing any memory space which contains words of various widths. However, the invention is described herein with particular reference to a digital signal processor (DSP) having contiguous memory space for storing data words of several possible lengths as well as program (instruction) words. For instance, the ADSP 21060 DSP chip manufactured by Analog Devices, Inc. of Norwood, Massachusetts utilizes an instruction set in which each instruction is 48-bits wide. The ADSP 21060 operates on data words which may be 16, 32 or 48-bits wide.

Figure 1:
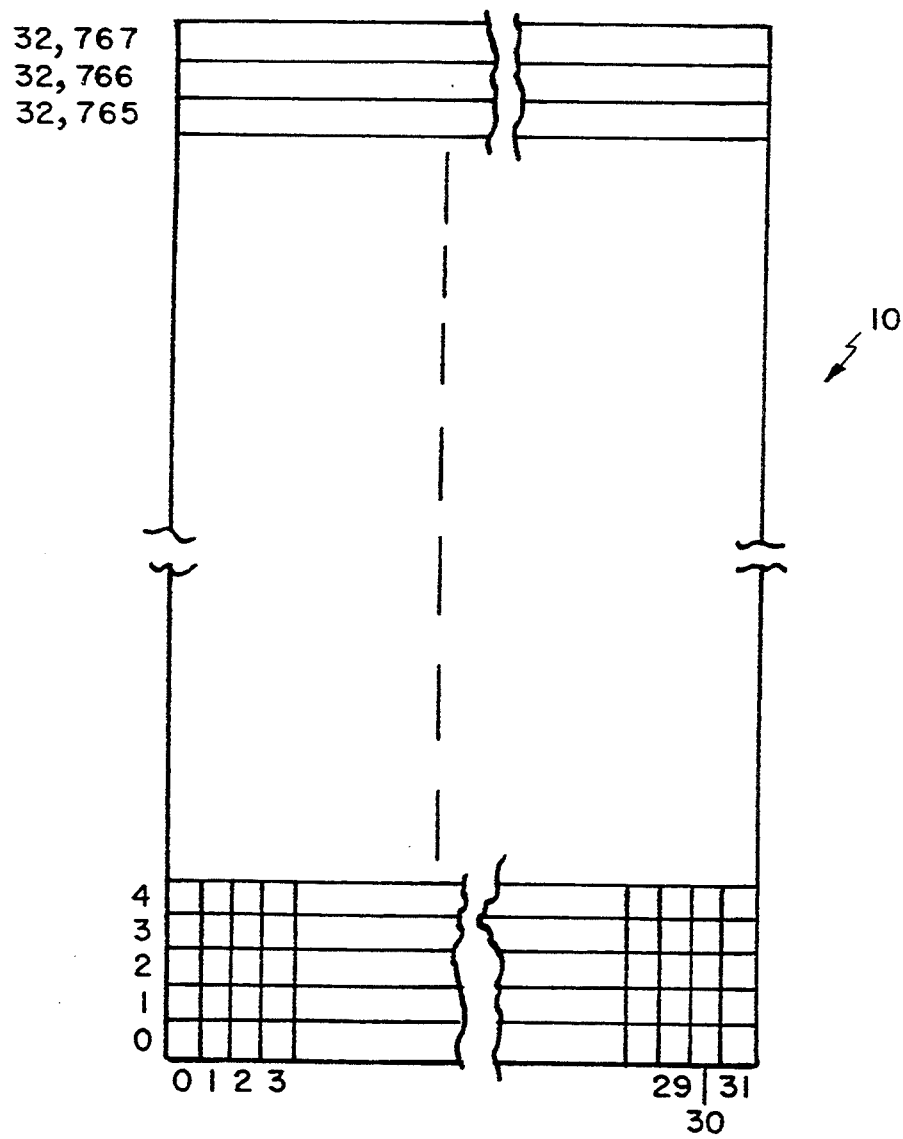
FIG. 1 is a diagrammatic representation of an exemplary memory module.

FIG. 1 is a diagrammatic representation of an exemplary memory module 10 containing space for storage of 32K (32,768) words, each word being 32-bits in length. Any particular word can be addressed by a 15-bit address.

Figure 2:
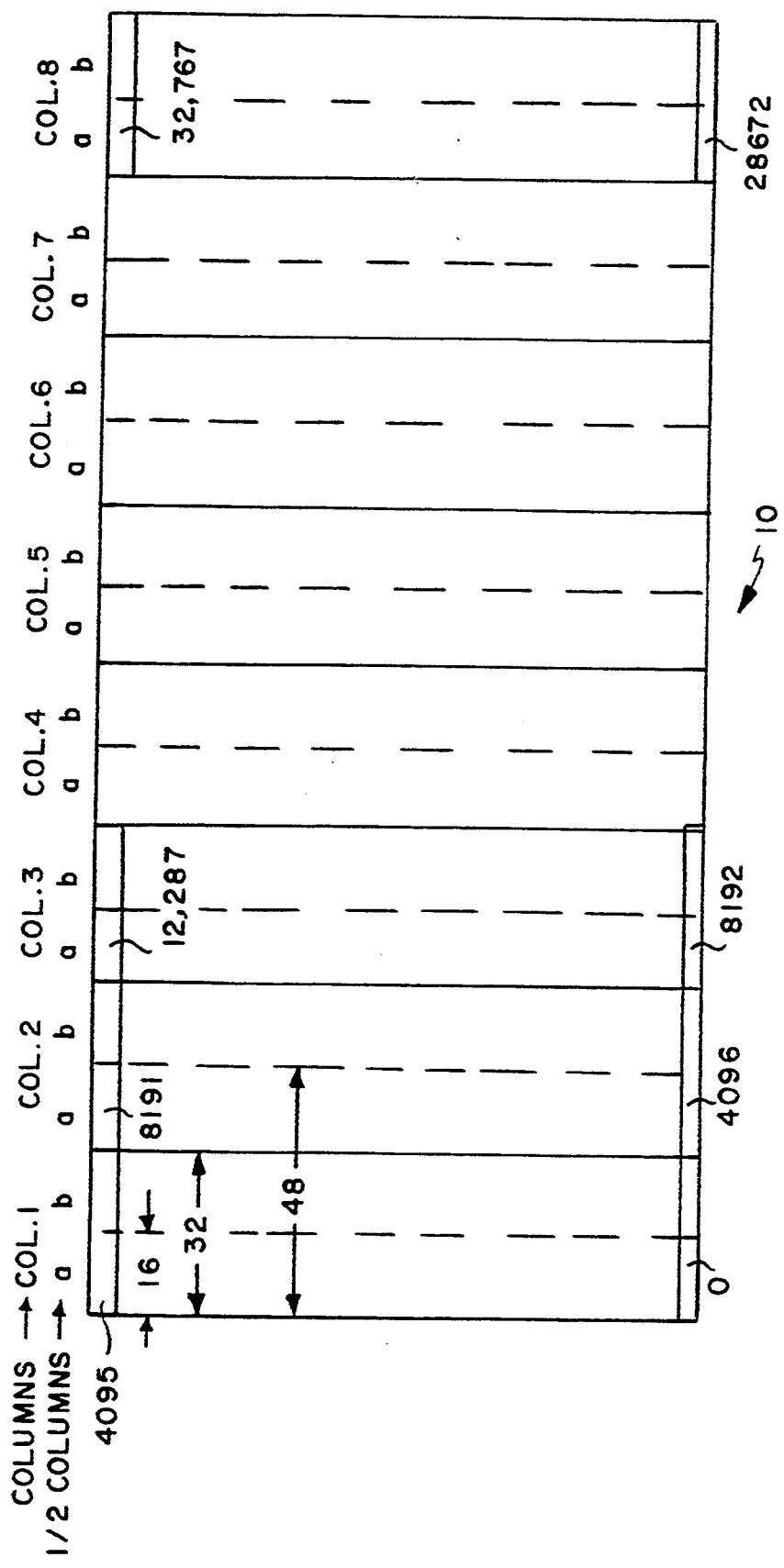
FIG. 2 is a diagrammatic representation of the memory module of FIG. 1 represented as a row and column matrix in accordance with the present invention.

In accordance with the present invention, the particular memory module shown in FIG. 1 can be represented as 8 columns of 32-bit words, each column comprising 4K words, i.e., 4K rows. As will become clear in the discussion below, this arrangement can also be considered to be sixteen half columns, each half column comprising 4K words (or rows) of 16-bit width. FIG. 2 is a diagrammatic illustration of the memory module configured in the above-described manner comprising columns 1–8, each column including two half columns labelled a and b.

Figure 3:
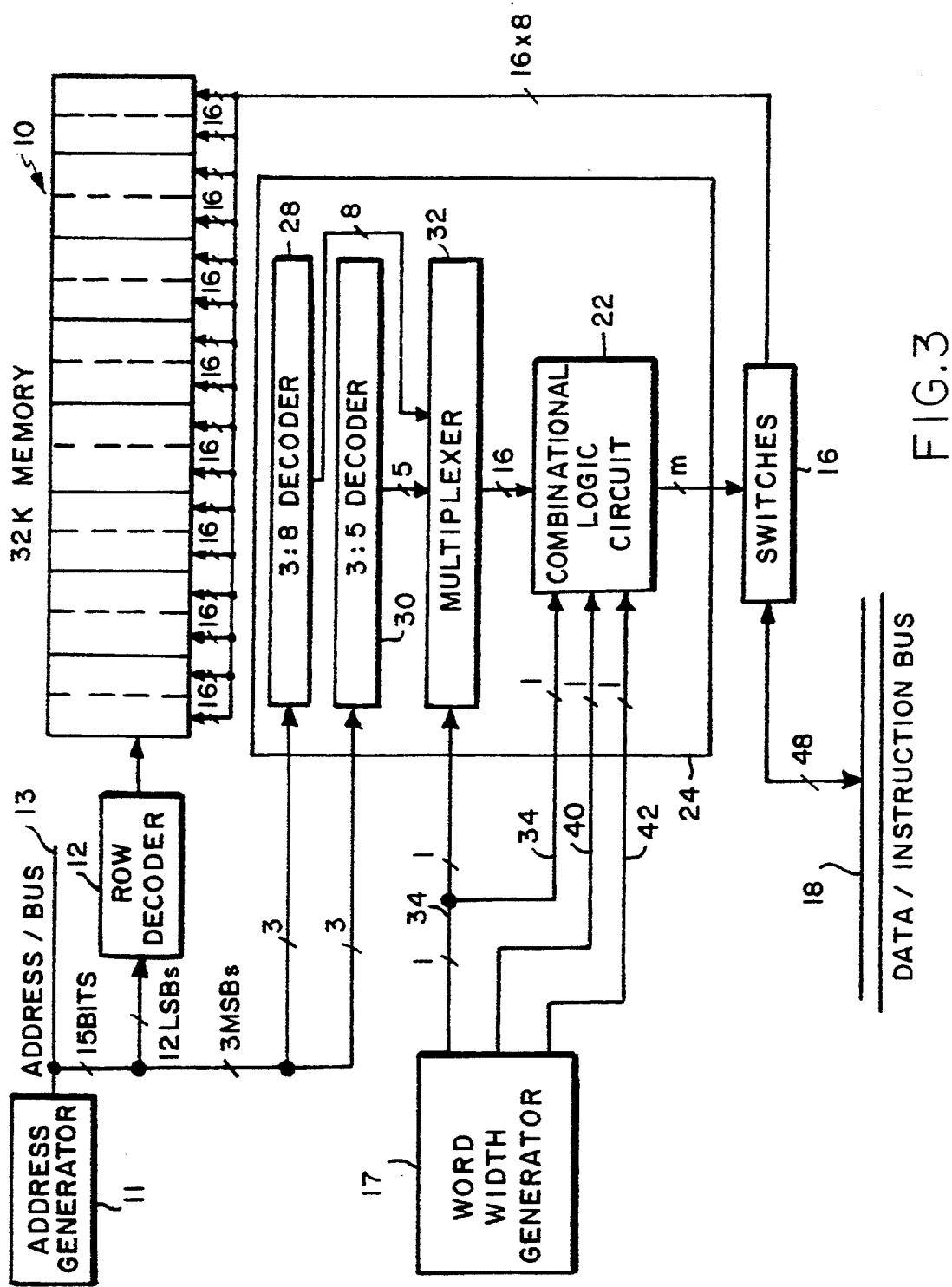
FIG. 3 is block diagram of a first embodiment of the present invention.

FIG. 3 is a block diagram of the apparatus of a particular embodiment of the present invention which is adapted to store data and/or instruction words of various widths, in which all words are C·M bits wide, where C is an integer and M is the number of bits in the smallest word which can be stored in the memory. In the particular embodiment illustrated, memory 10 can accommodate 16, 32 and 48-bit data and instructions. 16-bit data is stored as either the high or low 16-bits of an addressable 32-bit memory word in a manner well known in the art. Memory module 10 is accessed by row decoder 12 in a standard fashion responsive to the 12 LSBs of the 15-bit address generated by address generator 11 and placed on address bus 13. Each switch 16 is controlled by the column decoder 24 and corresponds to a columnar portion of the memory module 10. The switches 16 comprise the connections between the memory module 10 and the other portions of the chip, e.g., the data/instruction bus 18. When one or more of switches 16 is enabled, communication is open between the corresponding bit positions in the memory module 10 and the bus 18. If a switch is not enabled, the bits of the selected row in the columnar portion of the memory module 10 corresponding to that switch cannot communicate with the bus or be changed.

Thus, depending on the condition of the various switches 16, some of the 256-bits in the selected row are coupled to the bus 18. Each switch should control as many bits as are contained in the smallest word in the memory, i.e., 16-bits wide in the exemplary system described herein. The various switches are enabled or disabled responsive to input signals from column decoder 24. Column decoder 24 comprises sub-decoders 28 and 30, multiplexer 32 and combinational logic 22.

Combinational logic circuit 22 is responsive to the outputs of multiplexer 32 and three additional signals from word width generator 17 which indicate whether 16, 32 or 48-bit data is being accessed and, if 16-bit data is being accessed, whether it is the high 16-bits or low 16-bits of the 32-bits of data accessed by the address on the address bus.

Sub-decoders 28 and 30 are responsive to the three MSBs of the address bus and an additional one bit signal 34. Sub-decoder 28 is a 3-bit to eight column (3:8) decoder. Sub-decoder 30 is a 3-bit to 5 column (3:5) decoder. Multiplexer 32 comprises sixteen individual one bit multiplexers 32a–32p. In the column decoder 24, the three MSBs on the address bus are fed to both the 3:8 sub-decoder 28 and the 3:5 sub-decoder 30. Multiplexer 32 is responsive to a one bit input 34 to pass the output of one of sub-decoders 28 and 30. When asserted, signal 34 indicates that 48-bit data is being accessed (hereinafter 48-bit word indicator signal). When 48-bit word indicator signal 34 is asserted, multiplexers 32a–32p select the output signals from the 3:5 decoder 30 to pass to combinational logic circuit 22, whereas, when it is not asserted, multiplexers 32a–32p select the inputs from the 3:8 decoder 28. The output of 3:5 sub-decoder 30 indicates 48 contiguous bits of the selected row, the particular 48-bits depending on the 3 MSBs of the address. However, if signal 34 is not asserted, then multiplexers 32a–32p instead pass signals from 3:8 decoder 28 to combinational logic 22. The combinational logic is configured such that a switch cannot be enabled unless, at least, the output of the corresponding multiplexer is high.

The outputs of sub-decoders 28 and 30 (i.e., the output of multiplexers 32a–32p) only provide part of the information needed to determine which switches to enable. If 48-bit word indicator signal 34 is not asserted, then it must be determined whether the accessed data is 16 or 32-bits wide and, if 16-bits wide, whether it is the low 16-bits or high 16-bits of the 32-bit wide selected column. Accordingly, combinational logic circuit 22 is responsive to at least signals 40 and 42 (as well as the output of multiplexers 32a–32p) for controlling the switches 16. The signal on line 40 (hereinafter termed 16-bit word indicator signal) indicates whether the data or instruction to be accessed is 16-bits wide or not.

If 16-bit word indicator signal 40 is not asserted, then combinational logic circuit 22 enables the two appropriate adjacent drive switches to couple 32 contiguous bits in memory module 10 to the bus 18. If 16-bit word indicator signal 40 is asserted, then signal 42 indicates whether the 16-bits to be accessed are the high 16-bits or low 16-bits of the 32-bit wide column (hereinafter H/L indicator signal) and, responsive thereto, combinational logic circuit 22 enables one of the switches 16.

Thus, as described above, the present invention comprises a memory space arranged as a matrix of rows and columns. All data in a given row is accessed by a designated number of bits of the address. Switches of bit width equal to the minimum bit width of data words which may be stored in the memory are controlled by column decoder 24 to select (1) the appropriate number of contiguous bits (depending on the word length selected), and (2) the appropriate starting point of the contiguous bits (depending on the address accessed), for connection to the bus.

FIGS. 4A and 4B illustrate two general cases for data configuration according to the present invention. The first case illustrated by FIG. 4A exemplifies situations in which the 48-bit data space size requires use of an odd number of half columns, e.g., (1) 4K or less 48-bit words (requiring use of part or all of the first three half columns), or (2) more than 8K but less than or equal to 12K of 48-bit words (requiring use of all of the first six half columns and all or part of the seventh to ninth half columns).

FIG. 4A illustrates an exemplary memory configuration in which space is provided for 1000 (all addresses and numbers are in decimal unless otherwise noted) 48K words, while the remainder of the memory space is dedicated to 16 and/or 32-bit data. In this case, addresses 0–999 access 48-bit data, which consumes the first 1000 rows (i.e., rows 0–999) in half columns 1a, 1b and 2a of the memory space. The 32-bit contiguous data begins in row 1000 of the second column (half columns 2a and 2b). Since this data begins in the 1000th row, the 12 LSBs of the address which access it must be 1000

(i.e., 001111101000 binary). The three MSBs of the address, which are provided to the column decoder, must be 0, 0, 1 binary (4096 decimal) to address column 2. Accordingly, the address of the first 32-bit data word is 4096+1000 or 5096. Therefore, rows 0–999 in half column 2b are unoccupied. Rows 1000 to 4095 in half columns 1a and 1b are also unoccupied.

If desired, rows 1000 through 4095 of half columns 1a and 1b can be used to store 16 or 32-bit data, however, this would cause the addressing of the 32-bit data to be discontiguous since 32-bit data would be found in addresses 1000 through 4095 and then starting from address 5096 and upwards.

If desired, the first 1000 rows of half column 2b may be used to store 16-bit data by employing a different memory addressing scheme to access those locations.

FIG. 4B illustrates the memory allocation when the 48-bit data requires an even number of half columns for storage. In the case illustrated in FIG. 4B, memory space is provided for 5096 48-bit words with the remainder of the memory dedicated to 32 and 16-bit data. In this situation, addresses 0–5095 access 48-bit data. Addresses 5096–9091 do not access any valid data. The first 32-bit data word is stored in the 1000th row of column 3. Accordingly, it is accessed by address 8K+1000, i.e., address 9192. Rows 0–999 in half column 2b are not used. However, as noted above with respect to the example shown in FIG. 4A, it can be used to store 16-bit data if a different addressing scheme is available.

Although rows 1000 through 4095 of half columns 1a and 1b in the case illustrated in FIG. 4A can be used to store 32 and/or 16-bit data, it may be undesirable to do so since this would create discontiguous addressing of 32-bit data.

The method and apparatus of the present invention significantly decreases, or entirely eliminates, the amount of memory space which must be wasted to accommodate data and/or instruction words of various widths.

Figure 5A:
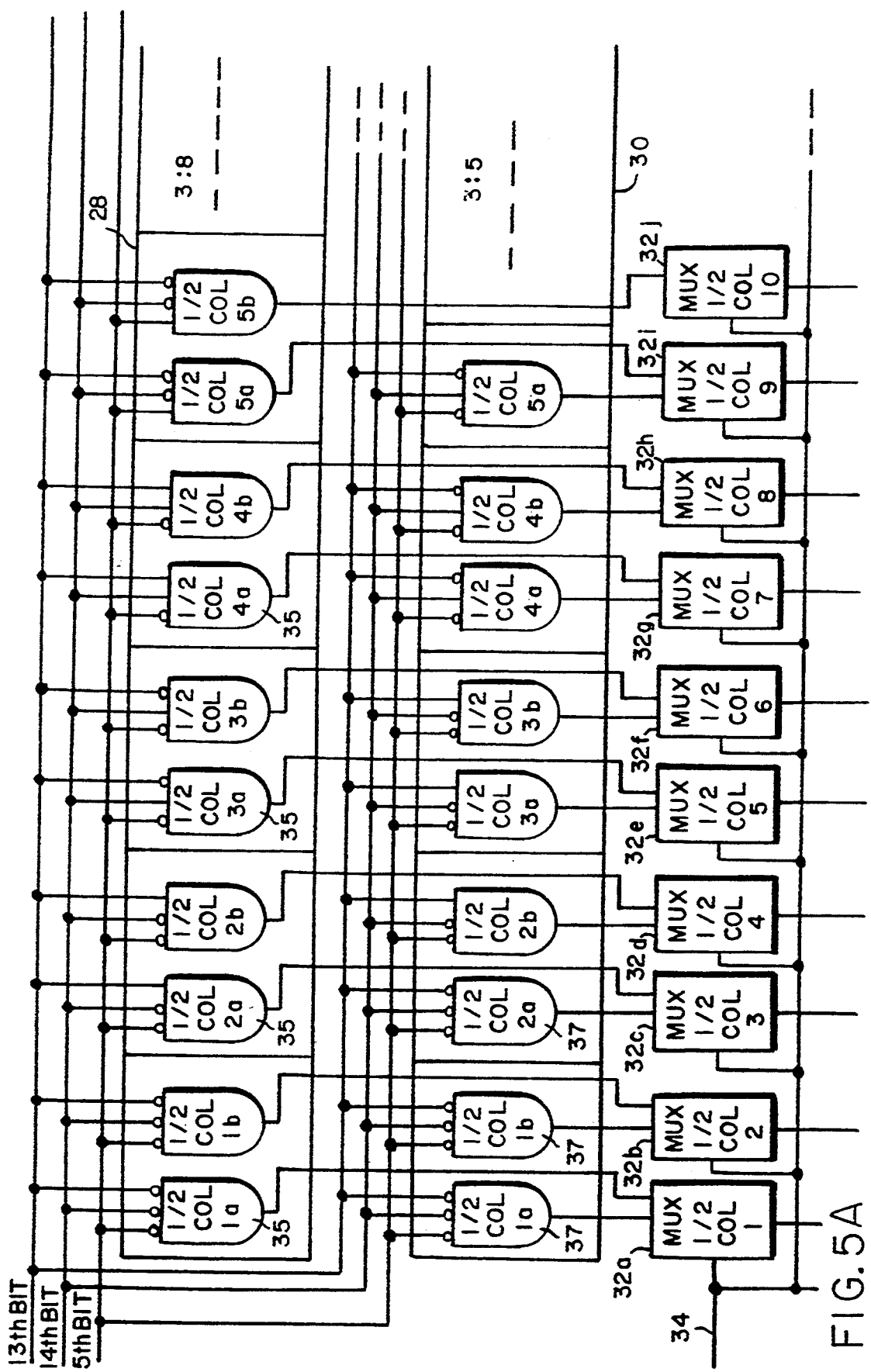
FIGS. 5A and 5B comprise a detailed logic diagram of the column decoder, related combinational logic circuitry, and column switches of the embodiment of the invention shown in FIG. 3.
Figure 5B:
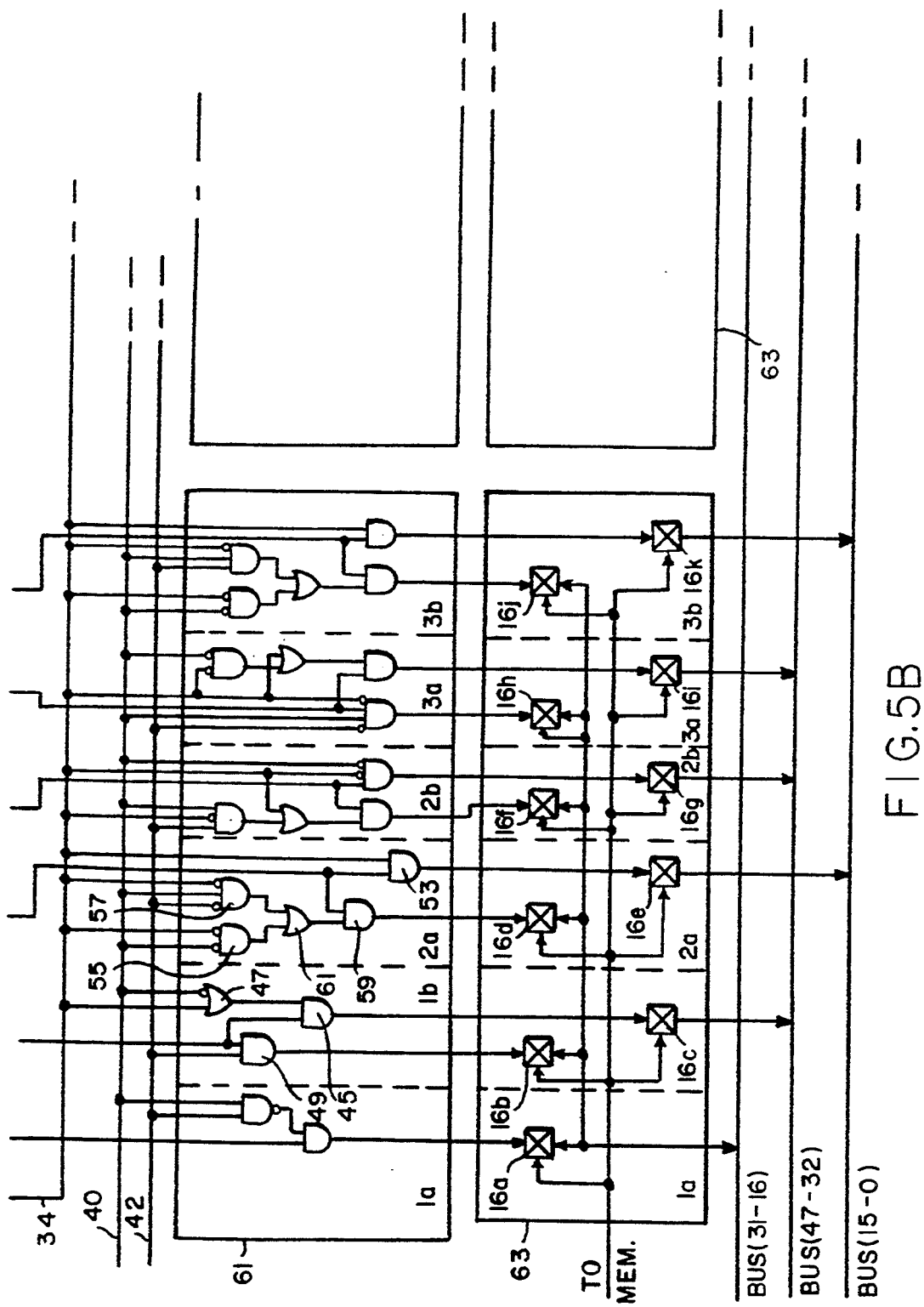

FIGS. 5A and 5B partially illustrate the logic circuitry of the column decoder 24 and switches 16 of a particular embodiment of the invention. The circuitry which is not shown is a repeat of the circuitry shown, as will be described more fully below. In this embodiment, all signals are assumed to be asserted in the high state.

As shown in FIGS. 5A and 5B, 3:8 decoder 28 comprises a series of AND-gates 35 having inputs coupled to the three MSBs of the address, each having an output coupled to a multiplexer. There is one AND-gate 35 in 3:8 sub-decoder 28 corresponding to each 16-bit half column. The inputs of each AND-gate are configured such that the output of the AND-gate is asserted when the 3 MSBs of the address indicate that the corresponding half column is being accessed. The AND-gates are arranged such that each adjacent pair has the same input configuration.

The 3:5 decoder 30 is similar to the 3:8 decoder 28 except that AND-gates 37 are configured in sets of three, each three adjacent AND-gates having the same input configuration.

There are 16 multiplexers 32a–32p in multiplexer box 32, one corresponding to each 16-bit half column. Generally, in the present invention, there will be A multiplexers, where A is the integer number of M bit-wide words which can fit in a row; M being the number of bits in the smallest word accessible in the memory. Multiplexers 32a–32p are controlled by 48-bit input word indicator signal 34 to pass the output from the AND-gates 35 of 3:8 decoder 28 only if the 48-bit line 34 is not asserted. Otherwise, the multiplexers are controlled to pass through the inputs from 3:5 decoder 30 while the 3:8 decoder outputs are ignored.

As can be seen from FIGS. 5A and 5B, in the 3:8 sub-decoder 28 (when accessing 32-bit data), half columns 1a and 1b of the memory array are activated when the three MSBs are 000, half columns 2a and 2b are activated when the three MSBs of the address are 001, half columns 3a and 3b are activated when the 3 MSBs of the address are 010, and so on until half columns 8a and 8b are activated when the three MSBs of the input address are 111.

In the 3:5 sub-decoder 30 (when accessing 48-bit data), half columns 1a, 1b and 2a are activated if the three MSBs of the input address are 000; half columns 2b, 3a and 3b are activated if the three MSBs of the input address are 001; half columns 4a, 4b and 5a are activated if the three MSBs of the input address are 010; half columns 5b, 6a and 6b are activated if the three MSBs of the input address are 011; and half columns 7a, 7b and 8a are activated if the three MSBs of the input address are 100. Half column 8b cannot be used for 48-bit data in the illustrated embodiment since five columns of 48-bit data would consume 15 of the 16-bit wide half columns, leaving one half column remaining and unusable for 32-bit data.

Also note that there would be no valid addresses for 48-bit data in the embodiment illustrated which could be accessed by an address in which the 3 MSBs are 101, 110 or 111, i.e., any address over 12K.

In the scheme as illustrated, the outputs of two or three adjacent multiplexers will be asserted depending on whether the data being accessed is 32 or 48-bits while the outputs of all other multiplexers will remain unasserted. The particular multiplexers asserted depend on the address (or more accurately, the three MSBs of the address).

Combinational logic circuit 22 essentially comprises logic for activating the appropriate switches 16 depending on the conditions of the outputs of the multiplexers and the three additional signals 34, 40 and 42 which indicate the length of the accessed word and, if it is 16-bits, its relative position in the accessed 32-bit column. Each switch is 16-bits wide and controls one half column of the memory. When a switch is activated it opens a path for data to flow between the bus 18 and the memory 10. Otherwise, the switches are closed and prevent the data in memory 10 from being affected (even in the row which is selected by the 12 LSBs on the address bus). During any given memory access, one, two or three consecutive switches are activated, depending on whether 16, 32 or 48-bit data is being accessed, while all other switches remain closed. The logic circuitry combines the output of the multiplexers 32a–32p with the 48-bit word indicator signal 34, the 16-bit word indicator signal 40 and the H/L indicator signal 42 so as to turn on the appropriate switch or switches.

Turning now to combinational logic 22 and switches 16, the order in which 16, 32 and 48-bit data is stored must first be understood. The 32-bit data is stored with the 16 LSBs in the first half column and the 16 MSBs in the second half column. 48-bit data is stored with the 16 LSBs in the third half column, the 16 middle bits in the first half column and the 16 MSBs in the second half column. As described above, 16-bit data can be stored in either the first or second half column of a 32-bit column. 16-bit data is always sent out on bit positions 31-16 of the bus. Thirty-two bit data is coupled to bit positions 47-16 of the bus in its natural order, i.e., the 16 MSBs go out to bit positions 47-32 of the bus, respectively, and the 16 LSBs go out to bit positions 31-16 of the bus, respectively. Finally, 48-bit data is placed on the bus in its natural order, i.e., the 16 MSBs being placed on bus bit positions 47-32, the 16 middle bits being placed on bus bit positions 31-16 and the 16 LSBs being placed on bus bit positions 15-0. Accordingly, depending on memory allocation to the three possible word widths as well as the word width being accessed, the data in a particular half column of the memory module may need to be coupled to a different set of 16 contiguous bits of the bus.

It should be understood that the data can be stored in the memory in any one of many possible bit order arrangements and can be placed on the bus in any one of many bit order arrangements so long as the programming on the chip is adapted to work with the selected bit ordering. Accordingly, the bit ordering arrangements of both the bus and the memory described above can be chosen arbitrarily.

As can be seen in FIGS. 5A and 5B, except for half column 1a, the 16-bits corresponding to each half column controlled by a switch may need to be delivered to different bit positions of the 48-bit bus depending on whether the half column is a 16-bit word, part of a 32-bit word or part of a 48-bit word. Accordingly, each of half columns 1b through 3b require multiple switches and the combinational logic circuitry must include logic for controlling all of such switches.

With respect to half column 1a, only one switch is needed since, if data from half column 1a is called for, it must be intended for bit positions 31-16 whether it is a 16-bit word, part of a 32-bit word or part of a 48-bit word. However, data (or instructions) in half column 1b can be intended for either the sixteen MSBs of the bus (bit position 47-32) or the middle 16-bits of the bus (bit position 31-16). For instance, if half column 16 is selected as 16-bit data (the low 16-bits of a 32-bit word in 32-bit column 1, it must be coupled to bit positions 31-16 of the bus. However, if half column 1b is activated as a portion of either a 32 or a 48-bit word, then it must be coupled to bit positions 47-32 of the bus. Accordingly, half column 1b comprises two switches 16b and 16c, the first switch 16b being coupled between the half column 1b of the memory and bit positions 31-16 of the bus and the second switch 16c being coupled between the second half column of memory and bit positions 47-32 of the bus.

Accordingly, the first switch 16b corresponding to half column 1b, should be activated only when H/L signal 42 is asserted and, of course, only if multiplexer 32b corresponding to half column 1b also is activated. Accordingly, the combinational logic necessary to control switch 16b is merely AND-gate 49 which receives at its inputs H/L indicator signal 42 and the output of multiplexer 32b.

Switch 16c in half column 1b should be activated if (1) multiplexer 32b is activated and (2) the word being accessed is 32 or 48-bits. Accordingly, the combinational logic necessary to control switch 16c comprises an OR-gate 47 having as inputs 48-bit word indicator signal 34 and the inverse of 16-bit word indicator signal 40. The output of OR-gate 47 is then AND-ed with the output of multiplexer 32b. The output of AND-gate 45 controls switch 26c.

As a further example, data in half column 2a can be accessed as (1) the 16 LSBs of a 48-bit word in half columns 1a, 1b and 2a (2) the 16 LSBs of a 32-bit word in half columns 2a-2b, or (3) a 16-bit word stored as the low 16-bits of a 32-bit location. If the word being accessed is 48-bits, then the output from half column 2a must be coupled to bit positions 15-0 of the bus. Otherwise the data in half column 2a should be coupled to bit positions 31-16 of the bus. Accordingly, switch 16d and the related combinational logic couples the memory to bit positions 15-0 of the bus if the appropriate conditions are met. Since the output from half column 2a is coupled to bit positions 15-0 of the bus only if the data being accessed is 48-bit data, the associated combinational logic simply comprises AND-gate 53 which turns on switch 16e if the 48-bit word indicator signal 34 is asserted and multiplexer 32c is asserted. On the other hand, AND-gates 55, 57 and 59 and OR-gate 61 are configured to be responsive to multiplexer 32c, H/L indicator signal 40, 16-bit word indicator signal 42 and 48-bit word indicator signal 34. They turn on switch 16d, coupling half column 2a to bit positions 32-16 of the bus, only if multiplexer 32c is asserted and either (1) a 32-bit word is being accessed, or (2) the high 16-bits of the associated 32-bit word is being accessed.

The combinational logic and switches for columns 4, 5 and 6 are shown in FIGS. 5A and 5B and should be self explanatory.

The combinational logic and switch configurations for half columns 4a, 4b, 5a, 5b, 6a and 6b is identical to those for half columns 1a, 1b, 2a, 2b, 3a and 3b, respectively. In fact, the combinational logic and switch configurations for all remaining columns would simply continue to repeat the pattern of half columns 1a, 1b, 2a, 2b, 3a and 3b, respectively. Thus, the combinational logic and switch configurations for the final four half columns, half columns 7a, 7b, 8a and 8b, would simply be a repeat of half columns 1a, 1b, 2a, and 2b, respectively.

If one of the many other possible bit ordering protocols were used, the logic circuitry and switch arrangement would have been adapted to that protocol and would be different from that shown in FIGS. 5A and 5B. In fact, even for the same ordering protocol used in exemplary FIGS. 5A and 5B, several other combinational logic possibilities exist.

In the exemplary system described above, the 3 MSBs of the address are used for column decoding and the 12 LSBs are used for row decoding. However, this particular bit arrangement is arbitrary. In fact, it is not even necessary that the bits for row and column decoding be split by MSBs and LSBs; they may be intermixed. It is merely necessary that the address comprise at least I+J bits, where I and J are integers, and that I bits are used for row decoding and J bits are used for column decoding.

Figure 6A:
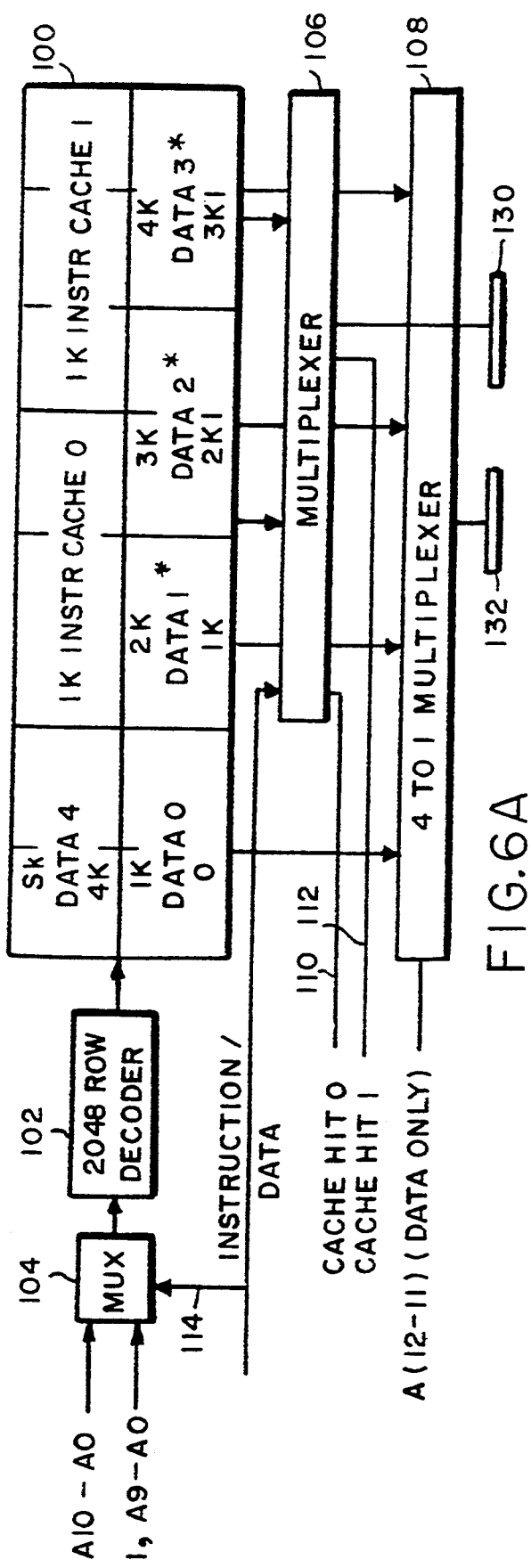
FIG. 6A is a block diagram of a second embodiment of the invention.
Figure 6B:
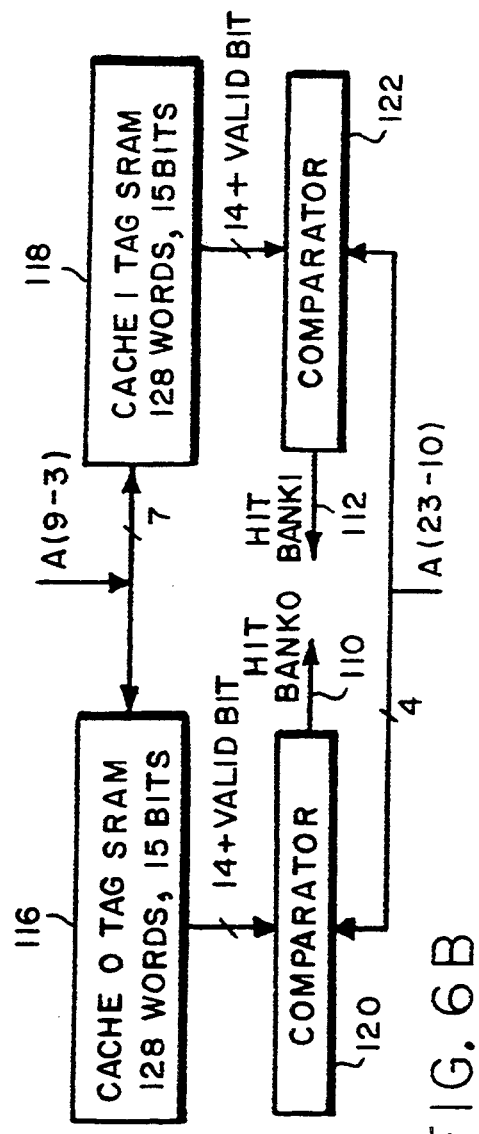
FIG. 6B is a block diagram of a tag memory arrangement for the embodiment of the invention shown in FIG. 6A.

Another particular embodiment of the invention in which the memory space stores 16 and 32-bit data as well as a two-way set associative instruction memory cache is illustrated in FIGS. 6A and 6B. The memory space 100 comprises 8K of 32-bit memory words arranged as a matrix of 2K rows and 4 columns. Alternately, it may be considered to comprise 8 half columns of 16-bit words. Each instruction cache, cache 0 and cache 1, are 1000 words deep and 48-bits (three 16-bit half columns) wide. Instruction cache 0 is located in half columns 2a, 2b and 3a, rows 1024–2047. Instruction cache 1 is located in half columns 3b, 4a and 4b, rows 1024 to 2047. The remaining memory comprises 16 or 32-bit data stored in 32-bit data words.

Row decoder 102 receives at its inputs 11-bits and decodes them to select a row of the matrix. When accessing data, multiplexer 104 provides to row decoder 102 11-bits of the data address (but not necessarily the 11 LSBs, as discussed more fully below). When accessing the instruction cache, only 10-bits of the address are used and are input to the 10 LSB inputs of the row decoder. The most significant bit input to the row decoder is set high for reasons which will be fully explained below.

In this embodiment, the column decoding control and the switching control are greatly simplified over the more general case illustrated by FIGS. 3 and 5. In this embodiment, the column decoding and switching are accomplished by multiplexer 106 and multiplexer 108.

The device further comprises multiplexer 106 and decoder 108. When the memory word being accessed is an instruction, multiplexer 106 is utilized. When the word being accessed is a data word, multiplexer 108 is utilized.

Referring first to instruction accesses, multiplexer 106 is responsive to control inputs cache hit 0-bit 110, cache hit 1-bit 112, and instruction/data bit 114. The two data input terminals of multiplexer 106 are coupled to the 48-bits of half columns 2a, 2b and 3a corresponding to instruction cache 0 and the 48-bits of half columns 3a, 4a and 4b corresponding to instruction cache 1, respectively. The data output of multiplexer 106 is coupled to an instruction bus 130. Depending on the condition of the three control inputs 110, 112 and 114, multiplexer 106 will do one of the following: 1) couple the 48-bit of half columns 2a, 2b and 3a (corresponding to instruction cache 0) to the instruction bus, 2) couple the 48-bit of half columns 3b, 4a and 4b (corresponding to instruction cache 1) to the instruction bus, or 3) disable multiplexer 106 such that no data is coupled to the instruction bus.

In the illustrated embodiment, each cache is 1K deep and is located in the upper 1K of the 2K deep columns. Accordingly, only 10-bits are needed to access the 1K of instructions in the caches. Thus, the 11th bit (counting from least significant bit to most significant bit) of the address in not used. Instead, the MSB input to the decoder is automatically set high to insure that all addresses access the upper 1K of the 2K rows of data in the memory space. Accordingly, multiplexer 104 is responsive to the instruction/data bit 114 for passing either address bit position A10 to the row decoder when the input address is for data or a preset high level when the input address is for instructions.

If bit 114 indicates that the word being accessed is data, multiplexer 106 is disabled. However, assuming that bit 114 indicates that the word being accessed is an instruction, multiplexer 106 is enabled and observes cache hit 0 and cache hit 1-bits 110 and 112. If cache hit 0-bit 110 is asserted, multiplexer 106 selects its first set of data inputs, corresponding to instruction cache 0, and passes the data through to the instruction bus 130. If cache hit 1-bit 112 is asserted, multiplexer 106 selects its second set of data inputs, corresponding to instruction cache 1, and passes the data through to the instruction bus 130. If neither of the cache hit bits 110 or 112 is asserted, a cache miss has occurred and the full address must be supplied to the main instruction memory to access the data.

FIG. 6B illustrates one possible apparatus for generating the cache hit bits 110 and 112. In this particular embodiment of the two-way set associative instruction cache, each set comprises eight 48-bit words. Accordingly, a tag memory for each cache, 116 and 118 respectively, is 128 (1/8th of 1K) words deep. Accordingly, address bits A9-A3. (7-bits) are utilized to access a tag in each of the cache tag memories 116 and 118. Each word in the cache tag memories comprises 14 tag bits plus a valid data bit. The selected tag from each of memories 116 and 118 is fed to comparators 120 and 122, respectively, where each is compared with address bits A23-A10. If a match is detected by either comparator 120 or 122, the corresponding hit signal 116 or 118, respectively, is asserted.

If the word being accessed is a data word, then multiplexer 106 is disabled and multiplexer 108 is enabled. Multiplexer 108 is a 2:4 decoder which receives at its control inputs the two bits of the address not input to the row decoder. The decoder receives at its four data inputs the four 32-bit columns of the memory space. Responsive to the two input address bits, 2:4 decoder 108 selected one of the 32-bits columns and outputs it to data bus 132.

This embodiment of the invention illustrates an additional feature by which the entire 8K memory space is utilized by storing the data in a discontiguous manner while appearing to the user to be contiguous. By rearranging the order of the bit in the address as they are input to row decoder 102, no memory is wasted and the user is not aware of the discontiguity of the data memory. As indicated in FIG. 6, the data addressing is as follows: (1) half columns 1a and 1b, rows 0 through 1K are addressed by addresses 0 through 1K, (2) half columns 2a and 2b, rows 0 through 1K are accessed by addresses 1K through 2K, (3) half columns 3a and 3b, rows 0 though 1K are accessed by addresses 2K through 3K, (4) half columns 4a and 4b, rows 0 though 1K are accessed by addresses 3K through 4K, and (5) half columns 1a and 1b, rows 1K+1 through 2K are addressed by addresses 4K through 5K.

The bits of the memory are rearranged to achieve this result as follows. Assuming that 13-bits are needed to address the data, then the normal order of the bits from MSB to LSB is defined as A12, A11, A10, A9, A8, A7, A6, A5, A4, A3, A2, A1, A0. However, by rearranging the address bits in the order from MSB to LSB of A10, A12, A11, A9, A8, A7, A6, A5, A4, A3, A2, A1, A0, the addresses will access the data as discussed above and indicated in FIG. 6. In other words, row decoder 102 decodes address bits A11, A9, AS, A7, A6, A5, A4, A3, A2, A1, A0 and column decoder 108 decoder address bits A10, A11. The rearrangement of the address bits input to row decoder 102 does not affect instruction cache addressing since, during instruction cache addressing, only address bits A9-A0 are utilized.

As an additional feature, it is also possible to store 2K of non-cached instructions in half columns 2a, 2b and 3a rows 0–1K and half columns 3b, 4a and 4b, rows 0–1K. In such an embodiment, however, multiplexer 104 would need to be replaced with a more complex system since, when accessing the non-cached instructions, address bit A10 would not be ignored.

Having thus described a few particular embodiments of the invention, various alterations, modifications and improvements will readily occur to those skilled in the art. Such alterations, modifications and improvements as are made obvious by this disclosure are intended to be part of this description though not expressly stated herein, and are intended to be within the spirit and scope of the invention. Accordingly, the foregoing description is by way of example only, and not limiting. The invention is limited only as defined in the following claims and equivalents thereto.

What is claimed is:

1. An apparatus for decoding an address to access a word in a memory space, said memory space being arranged as a matrix of rows and columns and being capable of storing words of various widths comprising;
   an address generator for generating an address of a selected word in said memory space, said address comprising at least I+J bits, where I and J are integers,
   a word width generator for generating a signal indicating the width of the word being accessed,
   a plurality of M-bit wide switches coupled between an M-bit wide columnar portion of said memory space and an M-bit wide portion of a bus, where M is an integer,
   a row decoder for indicating a row of said matrix by decoding I bits of said address,
   a column decoder having an output coupled to control said switches for indicating appropriate ones of said switches responsive to said J bits of the address and said word length indicator signal, said column decoder comprising;
   a plurality of sub-decoders, each sub-decoder corresponding to a word width which is storable in said memory space, each sub-decoder asserting a column output signal identifying a columnar portion of the memory space responsive to said J bits of said address, the width of said columnar portion being equal to the corresponding word width,
   a multiplexer for selecting and outputting to said switches the column signal of one of the sub-decoders responsive to the word width indicator signal, and wherein said switches selectively provide a communication link between said bits of said memory space indicated by said row and column decoders and the corresponding portion of said bus when said switches are activated.

2. An apparatus as set forth in claim 1 wherein said I bits used for row decoding are the I least significant bits of said address and said J bits for column decoding are the J most significant bits of said address.

3. An apparatus as set forth in claim 1 wherein M is the number of bits in the smallest word width accessible.

4. An apparatus as set forth in claim 3 wherein said various word widths are all of the form C*M, where C is an integer.

5. An apparatus as set forth in claim 4 wherein said column decoder further comprises a combinational logic circuit responsive to the output of said multiplexer and said word width indicator signal for activating selected ones of said switches.

6. An apparatus as set forth in claim 5 wherein said I bits used for row decoding are the I least significant bits of said address and said J bits for column decoding are the J most significant bits of said address.

7. An apparatus as set forth in claim 4 wherein said memory space is capable of storing words of M, 2M and 3M bit widths and said sub-decoders comprise first and second sub-decoders, said first sub-decoder having a column output signal which identifies a 2M bit wide columnar portion of said memory matrix responsive to said J bits of said address, said second sub-decoder having a column output signal which identifies a 3M bit wide columnar portion of said memory matrix responsive to said J bits of said address.

8. An apparatus as set forth in claim 7 wherein said word width indicator signal comprises (1) an H/L signal which, when the word to be accessed is an M bit word, indicates whether it is the high M bits or low M bits in a 2M bit column, (2) a 3M-bit word indicator signal, and (3) an M bit word indicator signal and wherein said column decoder further comprises a multiplexer which selects the output of the second sub-decoder if said 3M bit word indicator signal is asserted and selects the output of the first sub-decoder otherwise.

9. An apparatus as set forth in claim 8 further comprising a combinational logic circuit responsive to the output of said multiplexer and said 3M bit word indicator signal, M bit word indicator signal and H/L signal for selectively activating said switches so as to couple the addressed word to the bus.

10. An apparatus as set forth in claim 9 wherein said multiplexer comprises A multiplexers, each multiplexer being M bits wide, where A is the number of M bit words which can fit in a row.

11. A method of decoding an address to access a word in a memory space, said memory space being arranged as a matrix of rows and columns and being capable of storing words of at least first and second widths, said method comprising the steps of;
   (1) generating an address for a selected word in said memory space, said address comprising I+J bits, where I and J are integers,
   (2) generating a word width signal indicating the width of the word being accessed,
   (3) selecting a row of said matrix responsive to I bits of said address,
   (4) selecting a columnar portion of said matrix responsive to the J bits of said address for each of said first and second possible word lengths,
   (5) selecting one of said columnar portions responsive to the word width signal, and
   (6) mapping the bits of said columnar portion to appropriate bit positions on said bus.

12. A method as set forth in claim 11 wherein said I bits referred to in step (3) are the I least significant bits of the address and said J bit referred to in step (4) are the J most significant bits of the address.

13. A method as set forth in claim 12 wherein said various word widths are all of the form C*M, where C is an integer.

* * * * *